US008829507B2

(12) United States Patent
Liu et al.

(10) Patent No.: US 8,829,507 B2
(45) Date of Patent: Sep. 9, 2014

(54) SEALED ORGANIC OPTO-ELECTRONIC DEVICES AND RELATED METHODS OF MANUFACTURING

(71) Applicant: General Electric Company, Schenectady, NY (US)

(72) Inventors: Jie Jerry Liu, Niskayuna, NY (US); Kevin Henry Janora, Niskayuna, NY (US); Xiaolei Shi, Niskayuna, NY (US); Rian Zhao, Niskayuna, NY (US); Jeffrey Michael Youmans, Niskayuna, NY (US); Srinivas Pravad Sista, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/706,478

(22) Filed: Dec. 6, 2012

(65) Prior Publication Data
US 2014/0158991 A1 Jun. 12, 2014

(51) Int. Cl.
*H01L 51/52* (2006.01)
*H01L 51/44* (2006.01)

(52) U.S. Cl.
CPC .............. *H01L 51/52* (2013.01); *H01L 51/44* (2013.01); *H01L 51/524* (2013.01); *H01L 51/5246* (2013.01)
USPC ..................................... 257/40; 257/E21.567

(58) Field of Classification Search
CPC ...................... H01L 51/56; H01L 2225/06548
USPC ................... 257/E33.044, E33.059, E21.567, 257/E51.026, 98
See application file for complete search history.

(56) References Cited

U.S. PATENT DOCUMENTS

| 7,344,901 | B2 | 3/2008 | Hawtof et al. |
| 7,407,423 | B2 | 8/2008 | Aitken et al. |
| 7,541,671 | B2 * | 6/2009 | Foust et al. .................... 257/688 |
| 7,989,812 | B2 * | 8/2011 | Yamazaki et al. ............... 257/72 |
| 8,148,179 | B2 * | 4/2012 | Aitken et al. ................... 438/22 |
| 8,344,603 | B2 * | 1/2013 | Sakaguchi et al. ............ 313/110 |
| 2002/0125817 | A1 | 9/2002 | Yamazaki et al. |
| 2005/0224935 | A1 | 10/2005 | Schaepkens et al. |
| 2007/0216300 | A1 | 9/2007 | Lee et al. |
| 2008/0048556 | A1 | 2/2008 | Logunov et al. |
| 2009/0221207 | A1 | 9/2009 | Russell et al. |
| 2009/0321726 | A1 | 12/2009 | Thompson |
| 2010/0237453 | A1 | 9/2010 | Bonekamp et al. |
| 2011/0045229 | A1 | 2/2011 | Takaya et al. |

FOREIGN PATENT DOCUMENTS

| EP | 1617494 A2 | 1/2006 |
| JP | 2009129597 A | 6/2009 |
| WO | 2004017441 A1 | 2/2004 |
| WO | 2005050751 A2 | 6/2005 |

OTHER PUBLICATIONS

PCT Search Report and Written Opinion dated Feb. 27, 2014 issued in connection with corresponding PCT Application No. PCT/US2013/072717.

* cited by examiner

*Primary Examiner* — Zandra Smith
*Assistant Examiner* — Paul Patton
(74) *Attorney, Agent, or Firm* — Mary Louise Stanford

(57) ABSTRACT

The disclosure relates generally to sealed electronic devices. More particularly, the invention relates to electronic devices employing organic devices having a seal. Packages having organic electronic devices are presented, and a number of sealing mechanisms are provided for hermetically sealing the package to protect the organic electronic device from environmental elements.

9 Claims, 9 Drawing Sheets

SEALED ORGANIC OPTO-ELECTRONIC DEVICES AND RELATED METHODS OF MANUFACTURING

BACKGROUND

The invention relates in general terms to organic electronic devices and packages, and to a process for producing them. In particular, the invention relates to a process for producing a hermetically encapsulated organic electronic device and package, and to a hermetically encapsulated organic electronic device and package.

Organic devices are low cost and high performance alternatives of the silicon semiconductor devices and are employed in various applications, such as, organic light emitting diodes (OLEDs), organic light sensors, organic transistors, organic solar cells, and organic lasers.

However, these organic devices require protection from environmental elements such as, moisture or oxygen, to prevent degradation of the device. Most of these devices are made of a layered structure incorporating different layers of materials each having diverse functionalities. One common way to protect these devices includes providing encapsulation to the layered structure. Typically, the procedure to encapsulate the organic device includes sandwiching the organic device between a substrate and an encapsulation layer such that there is a continuous perimeter seal around the device. Often, sheets of glass, metal, or plastics having barrier coatings are used to sandwich the device. These sheets are joined together with adhesives.

In the past, thinner layers of adhesives have been employed between the substrate and the encapsulation layer to limit the diffusion of undesirable elements such as, water and/or oxygen into the package. While the rate of diffusion is reduced by employing thinner layers of adhesives, the adhesive remains quite permeable to environmental elements. Adhesives having fewer interfacial voids at the unions of the adhesive and the sheet materials lead to slower diffusion rates of the adhesive into the package during fabrication, thereby resulting in insufficient coverage of the encapsulant perimeter around the device. Additionally, moisture absorber or getters may be employed on the surface of the encapsulant or may be incorporated into the package to prevent any intruding water from entering the package. However, these materials are expensive and also have limited capacity in terms of preventing the permeation of environmental elements into the encapsulant.

Accordingly, there is a need for electronic packages employing sealing materials that reduce the permeation of environmental elements through the edges of the devices, as compared to conventional devices. Further, some applications require mechanical flexibility and conformability, including flexible display, flexible lighting and flexible detectors. Presently, it is difficult to achieve the desired hermetic seal and mechanical flexibility simultaneously using conventional encapsulation methods. Thus, there is also a need in the art to develop an encapsulation scheme that meets these higher requirements.

SUMMARY

Aspects of the present disclosure provide a hermetically sealed package and methods of fabricating same. Though some aspect of the disclosure may be directed toward the fabrication of components for the semiconductor industry, for example, computer components, including displays and monitors, aspects of the present disclosure may be employed in the fabrication of any component in any industry, in particular, those components that require hermetic sealing.

Briefly, in one aspect, the present invention relates to a packaged optoelectronic device. The packaged optoelectronic device includes at least one optoelectronic device with a cathode and an anode. The at least one optoelectronic device is sandwiched between a first and a second barrier layer.

One aspect of the present disclosure is an organic optoelectronic device. The device comprises a first barrier layer, a second barrier layer, and an organic optoelectronic device sandwiched between the first barrier layer and the second barrier layer, wherein at least a portion of an inner surface of the first barrier layer and at least a portion of an inner surface of the second barrier layer are in direct contact and form a seal. The device can be a hermetically sealed.

In one embodiment, the organic opto-electronic device further comprises an overcoating layer disposed between the inner surface of the second barrier layer and a second electrode of the device. The width of the contact between the first barrier layer and the second barrier layer is, in one example, from about 0.1 mm to 100 mm. In one example, each of the first barrier layer and the second barrier layer has a gear-shaped surface profile. In a related example, the profiles of the first and second barrier layers are complementary to each other.

The organic opto-electronic device, in one example, further comprises a third barrier layer located at corners of the device, joined to the first and second barrier layers. In one embodiment, the organic opto-electronic device further comprises a third barrier layer, wherein the third barrier layer is in contact with both the first barrier layer and the second barrier layer, and forms a seal. The third barrier layer, in one example, is in contact with the inner surface of the first barrier layer and the outer surface of the second layer, and forms a seal. In another example, the third barrier layer is in contact with the outer surface of the first barrier layer and the outer surface of the second layer. In one embodiment, the optoelectronic device further comprises an overcoating layer disposed between the inner surface of the second barrier layer and the second electrode of the device.

One aspect of the present disclosure is an organic opto-electronic device that comprises a first barrier layer having an inner surface and an outer surface, a second barrier layer having an inner surface and an outer surface, an optoelectronic device disposed between the inner surface of the first barrier layer and the inner surface of the second barrier layer, and a third barrier layer joined to both the first barrier layer and the second layer using an encapsulant.

In one example, at least a portion of the inner surface of the first barrier layer and at least a portion of the inner surface of the second barrier layer are in direct contact. The encapsulant comprises, in one example, one or more of an organic adhesive, a ceramic material, and a metal alloy. In one embodiment, the encapsulant is selected from the group consisting of epoxy, acrylate, low melting glass, frit glass, solder glass, silicon carbide, $Bi_2O_3$, $P_2O_5$, bismuth-containing fusible alloys.

One aspect of the present disclosure is a method of making an organic opto-electronic device. The method includes providing a first barrier layer, constructing an organic opto-electronic device comprising a first electrode, at least one organic layer and a second electrode, contacting a second barrier layer with both the OLED and the first barrier layer, and joining the contact points between the first and second barrier layers using local heating.

In one embodiment, the first barrier layer is selected from the group consisting of a rigid or a flexible glass sheet. The second barrier layer is, in one example, a flexible glass sheet. In one example, the present disclosed method further comprises overcoating the OLED device with a protecting insulating layer before contacting the second barrier layer. The second barrier layer is, in one example, larger than the overcoating in at least one dimension. In another example, the second barrier layer is smaller than the first barrier layer in at least one dimension.

In one embodiment of the presently disclosed method, a third barrier layer is brought into contact with the first barrier layer and the second barrier layer and overlaps with a portion of the first barrier layer and a portion of the second barrier layer. The third barrier layer is, in one example, brought into contact with the outer surface of the first barrier layer and the outer surface of the second barrier layer and overlaps with a portion of the first barrier layer and a portion of the second barrier layer.

Another aspect of the present disclosure relates to a method of making an organic opto-electronic device. The method includes providing a first barrier layer comprising two anode pads electrically connected in one end and a separate electrically-conductive pad, disposing at least one organic material layer over the two anode pads, disposing two cathode pads over said organic layer wherein the two cathode pads are in direct contact and electrically connected, disposing a second barrier layer over said cathode pads wherein the second barrier layer is in contact with the two electrically connected pads, and joining a third barrier layer to both the first barrier and the second barrier using heat or an adhesive. In an embodiment, the anode and cathode pads are selected from conductive oxides, metals, or conductive adhesives/pastes.

The device may be at least one of an electronic device, an optoelectronic device, an optical device, a light-emitting device, an organic-electronic device including an organic emitting light diode ("OLED") device, an organic semiconducting device, a polymer light emitting diode (PLED) device, an LCD display device, a photovoltaic device, a thin-film sensor, and an evanescent waveguide sensor. In the instant application, "organic opto-electronic device," includes, but is not limited to, organic light-emitting devices ("OLEDs"), organic photodiodes ("OPDs"), organic photovoltaic devices ("OPVs"), and organic thin-film transistors ("TFTs").

These and other aspects, features, and advantages of this disclosure will become apparent from the following detailed description of the various aspects of the disclosure taken in conjunction with the accompanying drawings.

BRIEF DESCRIPTION OF THE FIGURES

The subject matter, which is regarded as the invention, is particularly pointed out and distinctly claimed in the claims at the conclusion of the specification. The foregoing and other features, aspects, and advantages of the disclosure will be readily understood from the following detailed description of aspects of the invention taken in conjunction with the accompanying drawings, wherein:

FIG. 2 shows that the structure further comprises an additional protection (insulating) layer disposed between the inner surface of the second barrier component and the device.

FIG. 5 shows that the structure further comprises a protection (insulating) layer.

FIG. 7 shows that the structure further comprises an electrical bus that helps spread current over a large area or multiple OLED pixels, or an electrical lead (that can be used as an electrical feed-through to an external power source). The exemplar structure having two bused OLED pixels is made as shown in FIGS. 7A to 7D.

DETAILED DESCRIPTION

Figure 1:
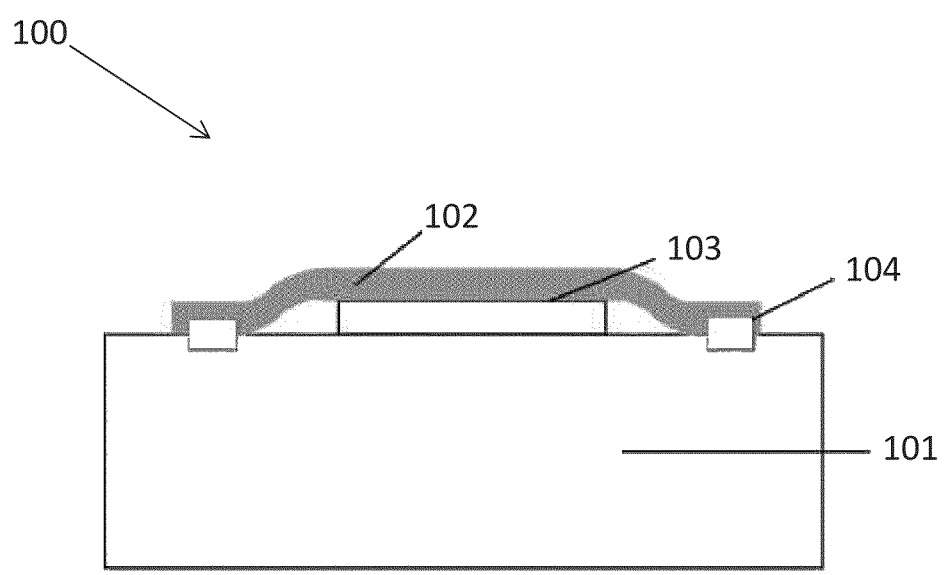
FIG. 1 shows a structure comprising a first barrier component, such as a rigid glass or a flexible glass substrate. The OLED device is constructed on top of this first barrier component. Then a second barrier component, which is larger than the OLED device, is brought into contact with both the OLED and the first barrier component. Further, a portion of the second barrier component overlaps and is in direct contact with a portion of the first barrier component. The overlapping area between the first and second barrier components is joined using local heating methods such as laser welding.
Figure 2:
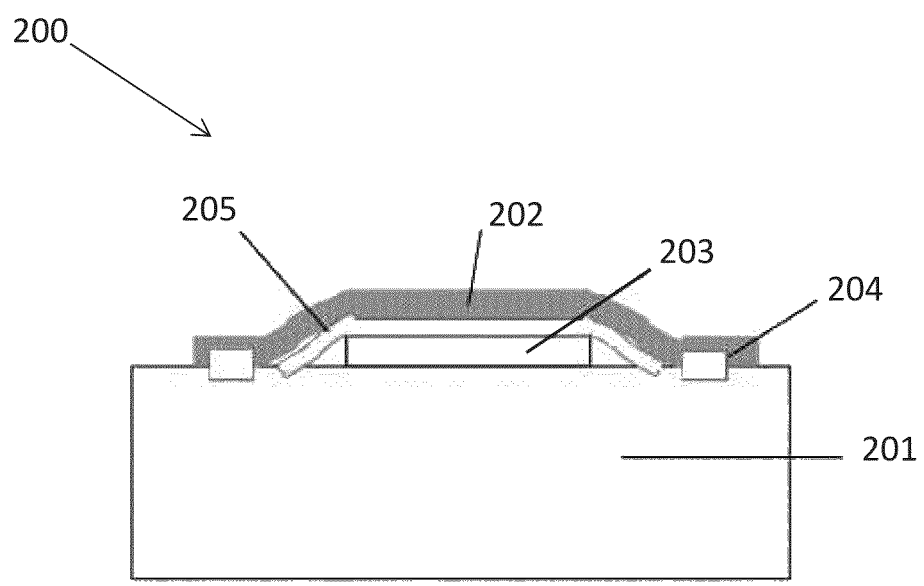
FIG. 2 is another embodiment of the present disclosure and related to FIG. 1.

Reference will be made below in detail to exemplary embodiments of the invention, examples of which are illustrated in the accompanying drawings. Wherever possible, the same reference numerals used throughout the drawings refer to the same or like parts.

Embodiments of the invention described herein relate to a packaged optoelectronic device. The packaged optoelectronic device includes an optoelectronic device that is sandwiched between two barrier layers and is sealed. Optoelectronic devices are structured to include an active layer disposed between two electrodes. In light emitting devices, when a power source connected between the two electrodes supplies electric energy to the two electrodes, current flows through the active layer and causes the active layer to emit light. On the other hand, in photovoltaic devices the active layer absorbs energy from light and converts this energy into electrical energy.

The optoelectronic devices include two electrodes, a cathode and an anode, which when connected to a power source allow the devices to either emit light or provide energy to the power source. When the electrodes of a light emitting optoelectronic device are connected to the power source and are excited by the power source, light is emitted. This phenomenon is used, for example, in display systems for mobile phones and television sets. Whereas, when the light is incident on photovoltaic devices, it provides electrical energy through the electrodes to the connected power source.

The present disclosure relates generally to the field of optoelectronic devices, and, specifically, to the field of packaged optoelectronic devices and methods for their manufacture. Optoelectronic devices generally include a wide array of devices that include, for example, light emitting devices used in display systems or photovoltaic devices used in energy generation systems. Examples of devices include, but are not limited to an electronic device, an optoelectronic device, an optical device, a light-emitting device, an organic-electronic device including an organic emitting light diode ("OLED") device, an organic semiconducting device, a polymer light emitting diode (PLED) device, an LCD display device, a photovoltaic device, a thin-film sensor, and an evanescent waveguide sensor. In the instant application, "organic optoelectronic device," includes, but is not limited to, organic light-emitting devices ("OLEDs"), organic photodiodes ("OPDs"), organic photovoltaic devices ("OPVs"), and organic thin-film transistors ("TFTs").

The present disclosure relates to a packaged optoelectronic device where the device includes at least one optoelectronic device with two electrodes, a cathode and an anode. The at least one optoelectronic device is sandwiched between a first and a second barrier layer. Aspects of the present disclosure provide a sealed package and methods of fabricating the sealed opto-electronic device. The device is, in one example, hermetically sealed. Though some aspect of the disclosure may be directed toward the fabrication of components for the semiconductor industry, for example, computer components, including displays and monitors, aspects of the present disclosure may be employed in the fabrication of any component in any industry, in particular, those components that require hermetic sealing, for example, organic light-emitting diodes.

Organic light-emitting diodes, or OLEDs, are examples of solid-state optoelectronic devices that can have several layers of organic material and polymers. Optoelectronic devices, e.g., OLEDs, generally comprise multiple thin film layers formed on a substrate such as glass or silicon. A light-emitting layer of a luminescent organic solid, as well as optional adjacent semiconductor layers, is sandwiched between a cathode and an anode. OLEDs have a number of beneficial characteristics, such as a low activation voltage, quick response, high brightness, high visibility, wide-angle viewing and capability for full-color flat emission displays, and an uncomplicated process for their fabrication. Thus, the OLEDs represent a promising technology for display applications and for general illumination.

However, optoelectronic devices, especially OLEDs, are generally prone to degradation under ambient environment conditions. For example, a common problem with OLED displays is sensitivity to moisture. Specifically, water vapor in the presence of oxygen may cause undesired crystallization and formation of organic solids within the device; undesired reactions at the electrode-organic layer interfaces; corrosion of metals and the undesired migration of ionic species; and the like. The water related degradation often manifests itself as the growth of dark spots in the emissive areas of the OLED, which can lead to performance loss, operational instability, poor color and emission accuracies, and shortened operational life. Dark spot growth in quantity, size and location is usually based upon the time and extent of exposure to degrading conditions.

To minimize such degradation mechanisms, optoelectronic devices, such as the organic light-emitting devices, are herein disclosed to be encapsulated and sealed, for example, hermetically sealed. In particular, the present disclosure relates to encapsulated electronic devices and methods for making the encapsulated optoelectronic devices. One aspect of the present disclosure is an organic opto-electronic device that includes a first barrier layer, a second barrier layer, and an organic optoelectronic device sandwiched between the first barrier layer and the second barrier layer, such that at least a portion of an inner surface of the first barrier layer and at least a portion of an inner surface of the second barrier layer are in direct contact and form a seal. Thin film encapsulation is advantageous over the use of glass or metal caps with epoxy sealants and desiccants because it is more cost effective and is a simpler method. The first barrier layer of the present disclosure, in one example, is selected from the group consisting of a rigid glass sheet or a flexible glass sheet. The second barrier layer is, in one example, a flexible glass sheet.

Some aspects of the present disclosure relate to the field of flexible substrates and specifically to the processing and handling of flexible displays and flexible electronics. In these application areas, there are existing short term and long term needs for substrates that exhibit improvements in durability, thickness, weight, bend radius, and cost. There is a desire for flexible substrates having dimensional stability, matched CTE, toughness, transparency, thermal capability, and barrier properties and/or hermeticity suitable for active matrix display fabrication. Metal (e.g., stainless steel), thermoplastics (e.g., Polyethylene naphthalate (PEN), Polyethersulfone (PES), Polycarbonate (PC), Polyethylene terephthalate (PET), Polypropylene (PP), oriented polypropylene (OPP)), and glass (e.g., borosilicate) substrates may be used.

One aspect of the present disclosure is an organic optoelectronic device that comprises a first barrier layer having an inner surface and an outer surface, a second barrier layer having an inner surface and an outer surface, an optoelectronic device disposed between the inner surface of the first barrier layer and the inner surface of the second barrier layer, and a third barrier layer joined to both the first barrier layer and the second layer using an encapsulant. The encapsulant comprises, in one example, one or more of an organic adhesive, a ceramic material, and a metal alloy. In one embodiment, the encapsulant is selected from the group consisting of epoxy, acrylate, low melting glass, frit glass, solder glass, silicon carbide, $Bi_2O_3$, $P_2O_5$, bismuth-containing fusible alloys.

The third barrier layer of the organic opto-electronic device is, in one example, located at corners of the device, joined to the first and second barrier layers. The third barrier layer is, in another example, in contact with both the first barrier layer and the second barrier layer, and forms a seal. This third barrier layer can be, in one example, in contact with the inner surface of the first barrier layer and the outer surface of the second layer, forming a seal. The sealing of the barrier layers, for example between the first barrier layer and the third barrier layer, may be a hermetic seal. The hermetic seal can be achieved optically using a laser or ultra violet (UV) light. In another example, the third barrier layer is in contact with the outer surface of the first barrier layer and the outer surface of the second barrier layer.

The organic optoelectronic device, in one example, is disposed between the first barrier layer and the second barrier layer and comprises a first electrode, at least one organic layer, and a second electrode. In one example, at least a portion of the inner surface of the first barrier layer and at least a portion of the inner surface of the second barrier layer are in direct contact. The width of the contact between the first barrier layer and the second barrier layer is, in one example, from about 0.1 mm to 100 mm. The first barrier layer and the second barrier layer each can have a gear-shaped surface profile. In a related example, the profiles of the first and second barrier layers are complementary to each other.

In one example, the organic opto-electronic device of the present disclosure further comprises an overcoating layer disposed between the inner surface of the second barrier layer and a second electrode of the device. The overcoating layer, in one example, comprises organic materials. Organic materials include, in one example, adhesives, thermoplastics, resins, or organic materials such as oxide, or fluoride. In one example, the present disclosed method further comprises overcoating the OLED device with a protecting insulating layer before contacting the second barrier layer. The second barrier layer is, in one example, larger than the overcoating in at least one dimension. The second barrier layer can alternatively be smaller than the first barrier layer in at least one dimension.

The organic optoelectronic device that is disposed between the first barrier layer and the second barrier layer comprises a first electrode, at least one organic layer, and a second electrode. In one embodiment, at least a portion of the inner surface of the first barrier layer and at least a portion of the inner surface of the second barrier layer are joined. The first barrier component and the second barrier component may have a gear-shaped surface profile, and/or be complementary to each other. In another embodiment, the third barrier layer is joined to both the first barrier layer and the second barrier layer using heat or adhesives. In one embodiment, the first and second barrier layers are joined together electrically or optically. The barrier layers can be joined together by using local heating, for example, by direct heating, microwave heating, and/or laser joining.

One aspect of the present disclosure is a method of making an organic opto-electronic device. The method includes providing a first barrier layer, constructing an organic opto-electronic device comprising a first electrode, at least one organic layer and a second electrode, contacting a second barrier layer with both the OLED and the first barrier layer, and joining the contact points between the first and second barrier layers using local heating.

In one embodiment of the presently disclosed method, a third barrier layer is brought into contact with the first barrier layer and the second barrier layer and overlaps with a portion of the first barrier layer and a portion of the second barrier layer. The third barrier layer is, in one example, brought into contact with the outer surface of the first barrier layer and the outer surface of the second barrier layer and overlaps with a portion of the first barrier layer and a portion of the second barrier layer.

Another aspect of the present disclosure relates to a method of making an organic opto-electronic device. The method includes providing a first barrier layer comprising two anode pads electrically connected in one end and a separate electrically-conductive pad, disposing at least one organic material layer over the two anode pads, disposing two cathode pads over said organic layer wherein the two cathode pads are in direct contact and electrically connected, disposing a second barrier layer over said cathode pads wherein the second barrier layer is in contact with the two electrically connected pads, and joining a third barrier layer to both the first barrier and the second barrier using heat or an adhesive. In an embodiment, the anode and cathode pads are selected from conductive oxides, metals, or conductive adhesives/pastes.

In one example, the organic opto-electronic device comprises a first barrier component 101, such as a rigid glass or a flexible glass substrate. The OLED device 103 is constructed on top of this first barrier component 101. Then a second barrier component 102, which is larger than the OLED device 103, is brought into contact with both the OLED and the first barrier component 101. Further, a portion of the second barrier component 102 overlaps and is in direct contact with a portion of the first barrier component 101. The overlapping area between the first and second barrier components 104 is joined using local heating methods such as laser welding. In a related example, the opto-electronic device further comprises an additional protection (insulating) layer 205 disposed between the inner surface of the second barrier component 202 and the device 203.

In one example, the organic opto-electronic device comprises a first barrier component 301; an OLED 303; a second barrier component 302 that is in direct contact with both the top surface of the OLED 303 and the first barrier component 301; a third barrier component 306 that is disposed atop of the second barrier component 302 and the first barrier component 301; a first joining 304 that joins the first barrier component 301 and the third barrier component 306; and a second joining 305 that joins the second barrier component 302 and the third barrier component 306. The first barrier component is larger than the second barrier component in at least one dimension. In one example, the opto-electronic device further comprises a protection (insulating) layer 507.

In one example, the organic opto-electronic device comprises a first barrier component 401 such as a rigid or flexible glass; an OLED 403; a second barrier component 402 that is in direct contact with both the top surface of the OLED 403 and the first barrier component 401; a third barrier component 406 that is in direct contact with the top surface of the second barrier component 402 and the bottom surface of the first barrier component 401; a first joining 404 that joins the first barrier component 401 and the third barrier component 406; and a second joining 405 that joins the second barrier component 402 and the third barrier component 406.

In one example, the organic opto-electronic device comprises a first barrier component 601; an OLED 603; a second barrier component 602 that is in direct contact with both the top surface of the OLED 603 and the first barrier component 601; a third barrier component 605 disposed over of the second barrier component 602 and the first barrier component 601; and a joining 604 that joins a portion of the third barrier component 605 to both a portion of the first barrier component 601 and a portion of the second barrier component 602. In a related embodiment, the organic opto-electronic device further comprises an electrical bus 706 that helps spread current over a large area or multiple OLED pixels, or an electrical lead which can be used as an electrical feed-through to an external power source. The exemplar structure having two bused OLED pixels is made as shown in FIGS. 7A to 7D.

Figure 7:
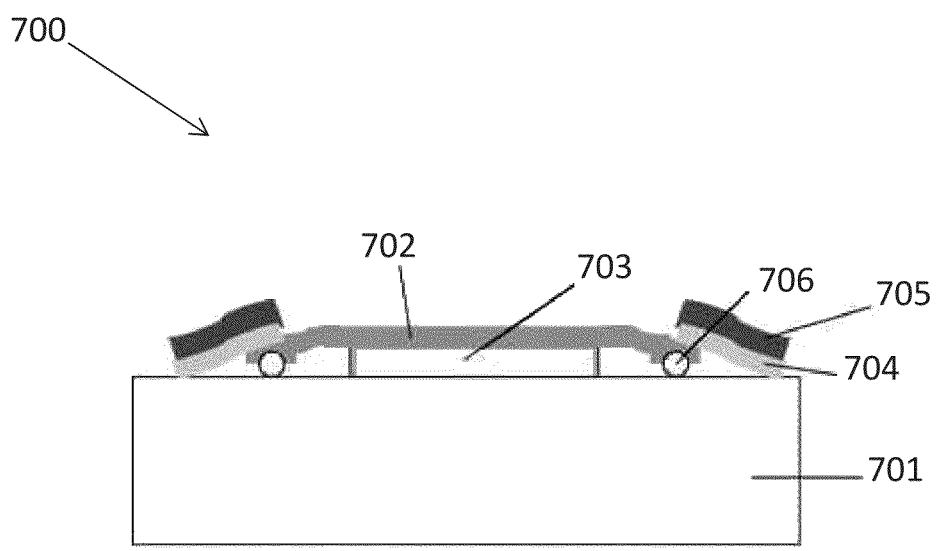
FIG. 7 is related to FIG. 6 and shows another embodiment of the present disclosure.

The exemplar structure having two bused OLED pixels, such as found in FIG. 7, is made as follows. First, a first barrier component such as a rigid or a flexible glass is provided. The first barrier component has two anode pads 712, which are electrically connected (bused) in one end (the grey pad on the right, connecting the two anode pads 712) and a separate electrically-conductive pad (the grey pad on the left, 711) (see FIG. 7A). Second, at least one organic material layer 721 is disposed over the two anode pads (see FIG. 7B), and the two cathode pads 731 are disposed over the organic layers and the two cathode pads 731 are in direct contact with the grey pad 711 on the left (or electrically bused by the grey pad 711) (see FIG. 7C). Then, a second barrier component 741 is disposed over the cathode pads 731 and in contact with the two electrical busing pads (see FIG. 7D). A third barrier component can then be joined to both the first barrier and the second barrier using an adhesive such as epoxies and UV-curables.

Figure 8:
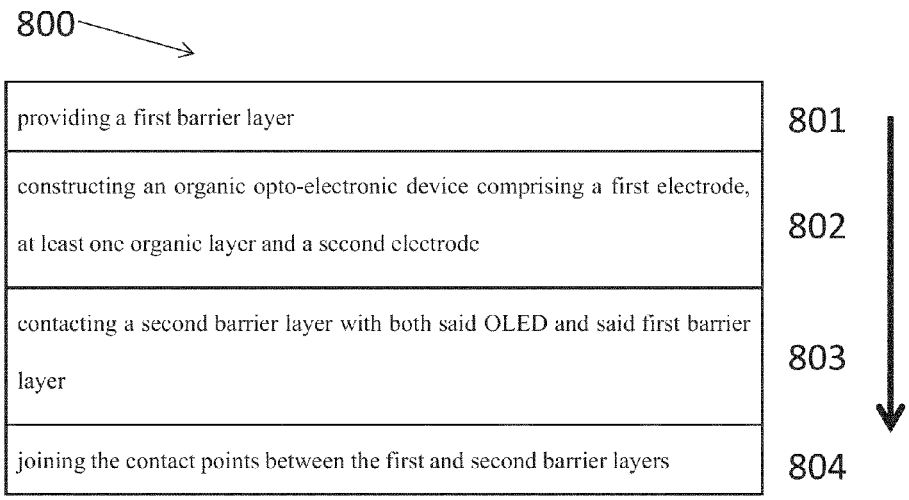
FIGS. 8 and 9 show flow charts, in accordance with aspects of the disclosure, illustrating methods for making an organic opto-electronic device.
Figure 9:
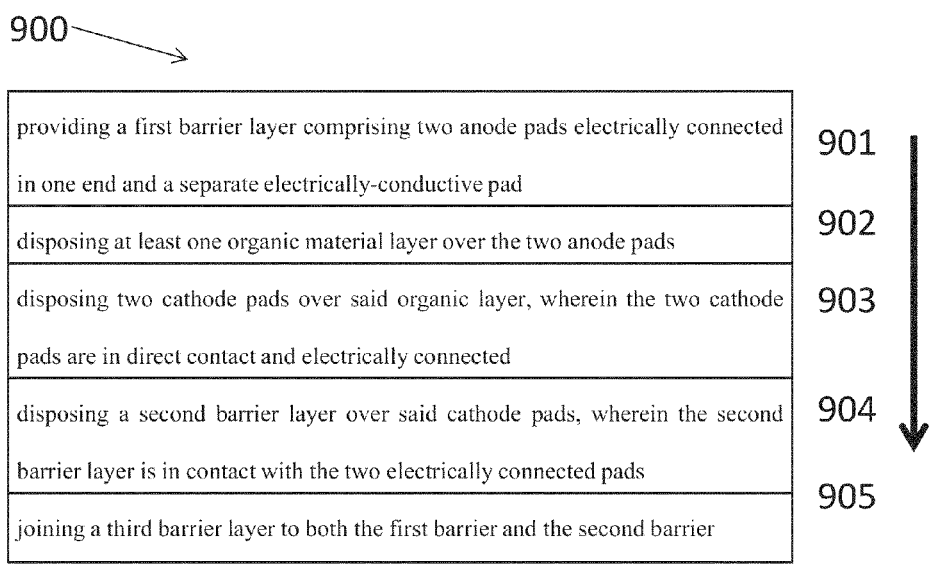

FIG. 8 shows a flow chart, in accordance with aspects of the disclosure, illustrating a method of making an organic optoelectronic device 800 by providing a first barrier layer 801; constructing an organic opto-electronic device comprising a first electrode, at least one organic layer and a second electrode 802; contacting a second barrier layer with both said OLED and said first barrier layer 803; and joining the contact points between the first and second barrier layers 804.

In one aspect, the disclosure is a method of making an organic opto-electronic device. As illustrated by the flow chart 900, the method comprises providing a first barrier layer comprising two anode pads 901; disposing at least one organic material layer over the two anode pads 902; disposing two cathode pads over said organic layer such that the two cathode pads are in direct contact and electrically connected 903; disposing a second barrier layer over said cathode pads such that the second barrier layer is in contact with the two electrically connected pads 904; and joining a third barrier layer to both the first barrier and the second barrier 905.

In some embodiments of the present disclosure, certain lamination means are possible, including pouch lamination, roll lamination and hot press lamination, and process parameters depend on the equipment utilized. It is apparent that release films, press pads, and tooling plates are necessary to perform these laminations. Moreover, steps to clean and remove moisture from all package materials may be performed during processing. For example, one or more of the barrier layers may be baked at 80° C. for 12 hours under vacuum to eliminate moisture. Other conditions may be used, including shorter times at higher temperatures under an inert atmosphere. The conditions will depend on the prior environmental exposure of the materials.

EXAMPLES

The disclosure, having been generally described, may be more readily understood by reference to the following examples, which are included merely for purposes of illustration of certain aspects and embodiments of the present disclosure, and are not intended to limit the disclosure in any way.

Various embodiments of flexible packaged optoelectronic devices and methods for their manufacturing are provided. Further, the packaged optoelectronic devices described in the application have a low cost of production and provide for a solution to the problem of moisture and oxygen ingression observed in optoelectronic packaging.

Shown in FIG. 1 is one embodiment of the invention. The structure comprises a first barrier component such as rigid glass and a flexible glass. A rigid glass refers to a glass sheet that, when used alone, can not be mechanically conformed under normal device processing conditions and normal operation conditions. A rigid glass typically refers to a glass sheet with a thickness of at least 0.2 mm. A flexible glass refers to a glass sheet that, when used alone, can be mechanically conformed or bent under normal device processing conditions. Alternatively, a flexible glass refers to a glass sheet with a thickness of about 0.2 mm or less; in one embodiment, the flexible glass sheet has a thickness of about 0.1 mm or less.

The OLED device comprises a first electrode, at least one organic material layer and a second electrode is then constructed on top of the first barrier component. Then a second barrier component, such as a flexible glass sheet, is brought into contact with both the OLED and the first barrier component. The second barrier component is larger than the active OLED area. Further, a portion of the second barrier component overlaps and is in direct contact with a portion of the first barrier component. The overlapping area is then joined using local heating methods such as laser welding.

In one example, the structure comprises an additional protection (insulating) layer disposed between the inner surface of the second barrier component and the device. The protection (insulating) layer can be a coating of organic materials such as, for example, epoxy and UV-curables, or a coating of inorganic dielectric materials such as, for example, oxides, fluorides and nitrides. Particular examples include, but not limited to, silicone oxide, barium oxide, calcium oxide, lithium fluoride, sodium fluoride. The insulating layer can also function as a mechanical protection layer, which protects the active OLED stack from damages that may occur during the encapsulation. The insulating layer can further have other functionalities such as moisture-barrier or moisture-getter properties.

In one example, the structure is made as follows. First, an OLED device comprising a first electrode, at least one organic material layer and a second electrode is constructed atop a first barrier component such as a rigid or flexible glass sheet. Then the active OLED is coated with a protection insulating layer. Then a second barrier component such as a flexible glass sheet is brought into contact with both the protection insulating layer and the first barrier component. The second barrier component is larger than the protection insulating layer. Further, a portion of the second barrier component overlaps and is in direct contact with a portion of the first barrier component. The overlapping area is then joined to seal the unit, using local heating methods such as direct laser welding.

In another example, the structure comprises a first barrier component such as a rigid or flexible glass; an OLED comprising a first electrode, at least one organic material layer and a second electrode; a second barrier component such as flexible glass in direct contact with both the top surface of the OLED and the first barrier component; a third barrier component such as a flexible or rigid glass disposed atop of the second barrier and the first barrier; a first joining that joins the first barrier component and the third barrier component; and a second joining that joins the second barrier component and the third barrier component. The first barrier component is larger than the second barrier component in at least one dimension.

In one example, the first step in the method includes an OLED device comprising a first electrode, at least one organic material layer and a second electrode that is constructed atop a first barrier component such as a rigid or flexible glass sheet. Then a second barrier component such as a flexible glass sheet is brought into contact with both the OLED and the first barrier component. The second barrier component is larger than the OLED, but smaller than the first barrier component in at least one dimension. Next, a third barrier component is brought into contact with the first barrier component and the second barrier component and overlaps with a portion of the first barrier component and a portion of the second barrier component. The overlapping areas of the first and third barrier components, and second and third barrier components are then joined and sealed using local heating methods such as laser welding.

Figure 3:
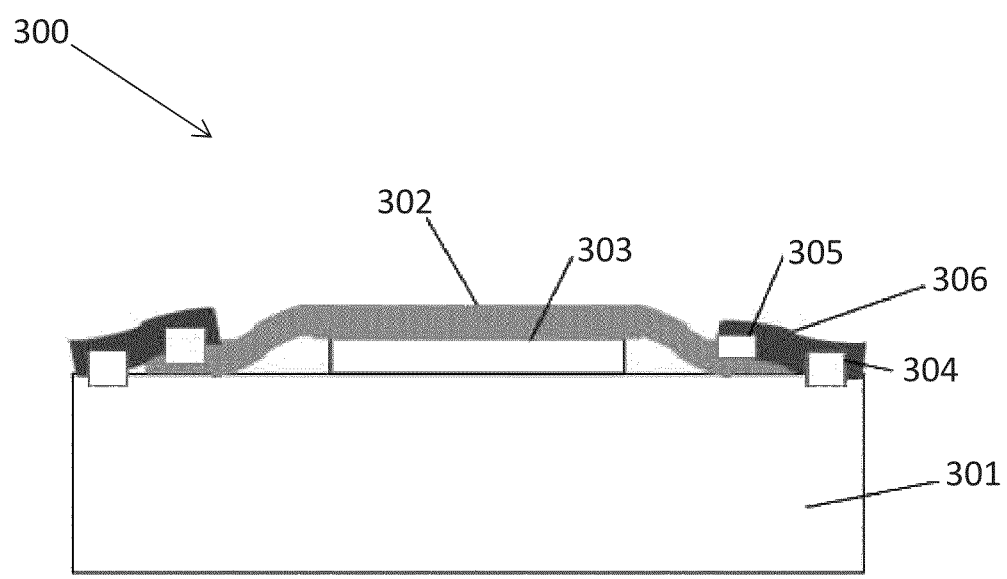
FIG. 3 shows a structure comprising a first barrier component; an OLED; a second barrier component that is in direct contact with both the top surface of the OLED and the first barrier component; a third barrier component that is disposed atop of the second barrier and the first barrier; a first joining that joins the first barrier component and the third barrier component; and a second joining that joins the second barrier component and the third barrier component. The first barrier component is larger than the second barrier component in at least one dimension.
Figure 4:
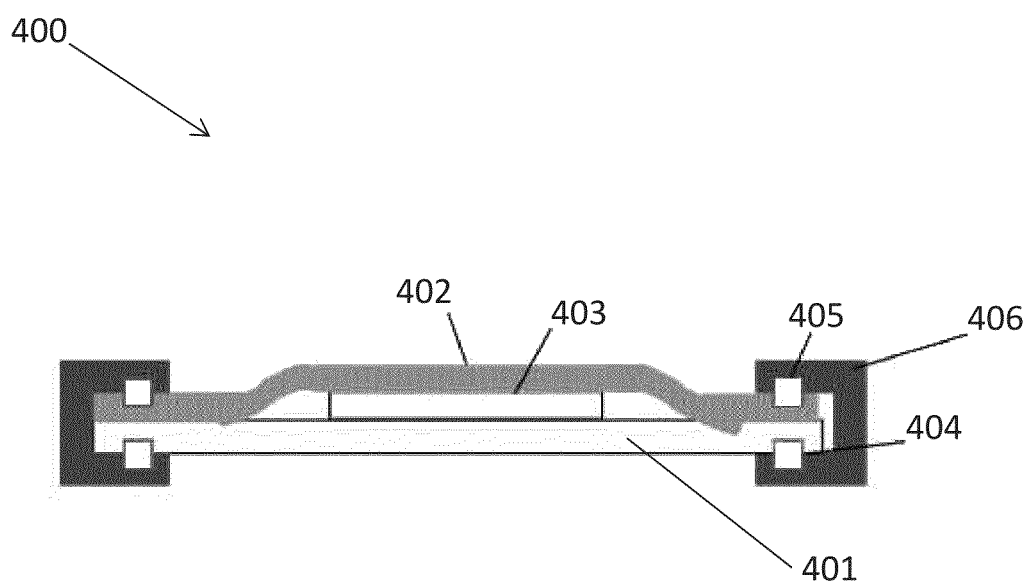
FIG. 4 is another embodiment of the present disclosure and related to FIG. 3. The structure comprises a first barrier component such as a rigid or flexible glass; an OLED; a second barrier component that is in direct contact with both the top surface of the OLED and the first barrier component; a third barrier component that is in direct contact with the top surface of the second barrier component and the bottom surface of the first barrier component; a first joining that joins the first barrier component and the third barrier component; and a second joining that joins the second barrier component and the third barrier component.

Shown in FIG. 4 is another embodiment of the invention alternative to FIG. 3. The structure comprises (1) a first barrier component such as a rigid or flexible glass, (2) an OLED comprising a first electrode, at least one organic material layer and a second electrode, (3) a second barrier component such as flexible glass in direct contact with both the top surface of the OLED and the first barrier component, (4) a third barrier component such as a flexible glass in direct contact with the top surface of the second component and the bottom surface of the first component, (5) a first joining that joins the first barrier component and the first barrier component and (6) a second joining that joins the second barrier component and the third component area.

The structure is made as follows. First, an OLED device comprising a first electrode, at least one organic material layer and a second electrode is constructed atop a first barrier component such as a rigid or flexible glass sheet. Then a second barrier component such as a flexible glass sheet is brought into contact with both the OLED and the first barrier component. The second barrier component is dimensionally larger than the OLED. Next, a third barrier is brought into contact with the bottom surface of the first barrier component and the top surface of the second barrier component and overlaps with a portion of the first barrier component and a portion of the second barrier component. The overlapping areas are then joined using local heating methods, for example laser welding.

Figure 5:
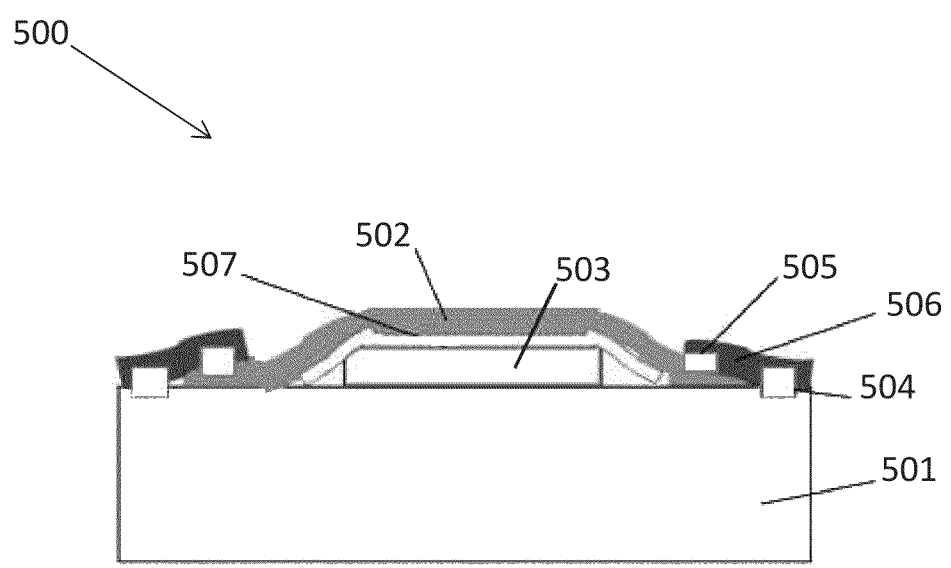
FIG. 5 shows another embodiment of the present disclosure and is related to FIG. 3.

Shown in FIG. 5 is another embodiment of the invention alternative to FIG. 3. The structure further comprises a protection (insulating) layer, in addition to the elements shown in FIG. 3. The protection (insulating) layer can be a coating of organic materials, for example epoxy and/or UV-curables, or a coating of inorganic dielectric materials such as oxides, fluorides, nitrides and the like. Particular examples include, but not limited to, silicone oxide, barium oxide, calcium oxide, lithium fluoride, sodium fluoride. The insulating layer can also function as a mechanical protection layer, which protects the active OLED stack from damages that may occur during the encapsulation. The insulating layer can further have other functionalities such as moisture-barrier or moisture-getter properties.

The structure is made as follows. First, an OLED device comprising a first electrode, at least one organic material layer and a second electrode is constructed atop a first barrier component such as a rigid or flexible glass sheet. Next, the active OLED is overcoated with a protection insulating layer. Then a second barrier component, such as a flexible glass sheet, is brought into contact with both the protection layer and the first barrier component. The second barrier component is dimensionally larger than the OLED and the protection layer, but smaller than the first barrier component in at least one dimension. Next, a third barrier is brought into contact with the first barrier component and the second barrier component and overlaps with a portion of the first barrier component and a portion of the second barrier component. The overlapping areas are then joined and sealed using local heating methods, for example by laser welding.

Figure 6:
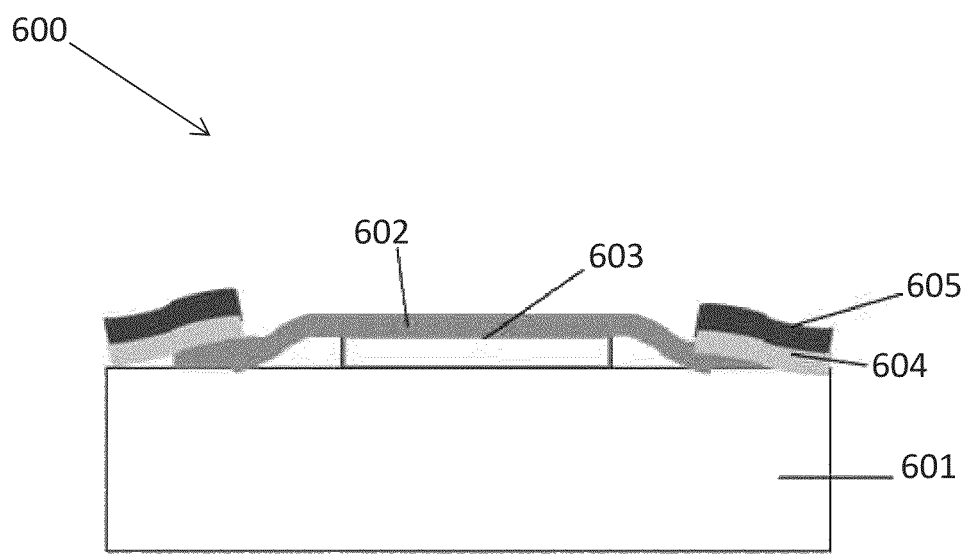
FIG. 6 shows another embodiment of the present disclosure. The structure comprises a first barrier component; an OLED; a second barrier component that is in direct contact with both the top surface of the OLED and the first barrier component; a third barrier component disposed over of the second barrier and the first barrier; and a joining (encapsulant) that joins a portion of the third barrier component to both a portion of the first barrier component and a portion of the second barrier component.

Shown in FIG. 6 is another embodiment of the invention alternative to FIG. 3. The structure comprises (1) a first barrier component such as a rigid or flexible glass, (2) an OLED comprising a first electrode, at least one organic material layer and a second electrode, (3) a second barrier component such as flexible glass in direct contact with both the top surface of the OLED and the first barrier component, (4) a third barrier component such as a flexible or a rigid glass or a metallic sheet disposed over of the second barrier and the first barrier and (5) a joining that joins the third barrier component to both the first barrier component and the second barrier component.

The structure is made as follows. First, an OLED device comprising a first electrode, at least one organic material layer and a second electrode is constructed atop a first barrier component such as a rigid or flexible glass sheet. Then a second barrier component such as a flexible glass sheet is brought into contact with both the OLED and the first barrier component. The second barrier component is larger than the OLED, but smaller than the first barrier component in at least one dimension. Next, a third barrier component, such as a glass sheet or a metallic sheet, is provided. The third barrier component is then joined to both the first barrier and the second barrier to provide a seal, using adhesives such as epoxies and UV-curables. FIG. 7 shows another embodiment of the invention. The structure is similar to FIG. 6 and further comprises an electrical bus, which helps spread current over a large area or multiple OLED pixels, or an electrical lead. Such an electrical lead can be used as an electrical feedthrough to an external power source.

The exemplar structure having two bused OLED pixels, such as found in FIG. 7, is made as follows. First, a first barrier component such as a rigid or a flexible glass is provided. The first barrier component has two anode pads 712, which are electrically connected (bused) in one end (the grey pad on the right, connecting the two anode pads 712) and a separate electrically-conductive pad (the grey pad on the left, 711) (see FIG. 7A). Second, at least one organic material layer 721 is disposed over the two anode pads (see FIG. 7B). Third, two cathode pads 731 are disposed over the organic layers and the two cathode pads 731 are in direct contact with the grey pad 711 on the left (or electrically bused by the grey pad 711) (see FIG. 7C). Forth, a second barrier component 741 is disposed over the cathode pads 731 and in contact with the two electrical busing pads (see FIG. 7D). Fifth, a third barrier component is then joined to both the first barrier and the second barrier using an adhesive such as epoxies and UV curables.

Figure 7A:
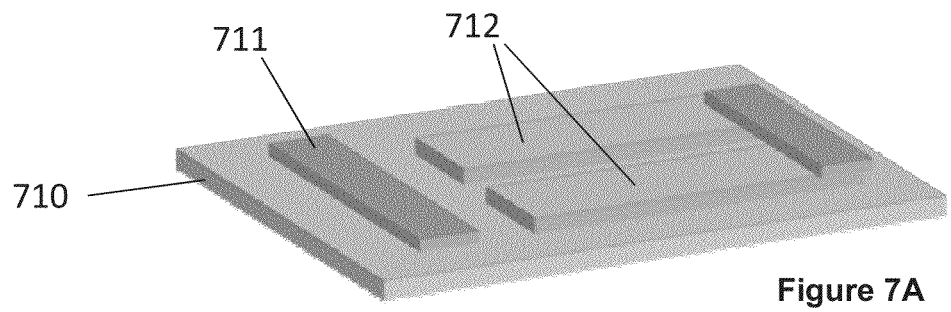
Figure 7B:
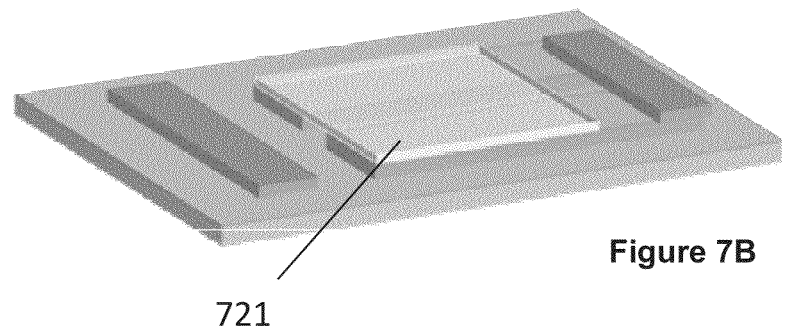
Figure 7C:
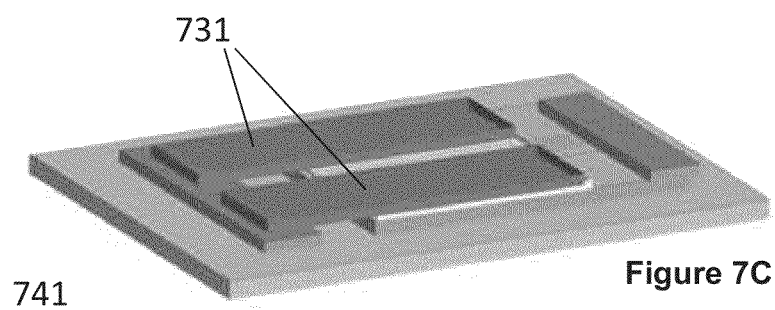
Figure 7D:
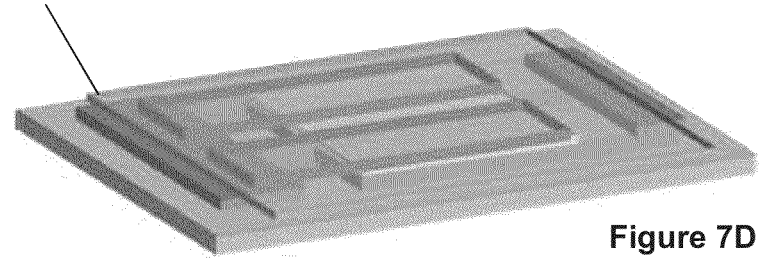

Materials suitable for the electrode pads and the busing pads shown in FIG. 7A include, but not limited to, conductive oxides such as indium tin oxide (ITO), tin oxide, zinc oxide and the like, or metals such as Al, Ag, Cu and the like, or conductive adhesives/pastes such as adhesive/pastes containing Ag particles.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of ordinary skill in the art upon reviewing the above description. The scope of the invention should, therefore, be determined with reference to the appended claims, along with the full scope of equivalents to which such claims are entitled.

In the appended description, the terms "including" and "in which" are used as the plain-English equivalents of the respective terms "comprising" and "wherein." Moreover, in the following claims, the terms "first," "second," etc. if any, are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable any person of ordinary skill in the art to practice the embodiments of invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

The invention claimed is:

1. A method of making an organic opto-electronic device comprising:
    (a) providing a first barrier layer comprising two anode pads electrically connected in one end and a separate electrically-conductive pad;
    (b) disposing at least one organic material layer over the two anode pads;
    (c) disposing two cathode pads over said organic layer, wherein the two cathode pads are in direct contact and electrically connected;
    (d) disposing a second barrier layer over said cathode pads, wherein the second barrier layer is in contact with the two electrically connected pads; and
    (e) joining a third barrier layer to both the first barrier and the second barrier using heat or an adhesive.

2. The method of claim 1, wherein the anode and cathode pads are selected from conductive oxides, metals, or conductive adhesives/pastes.

3. The method of claim 1, wherein the first barrier layer is selected from the group consisting of a rigid or a flexible glass sheet.

4. The method of claim 1, wherein the second barrier layer is a flexible glass sheet.

5. The method of claim 1, additionally comprising overcoating the OLED device with an insulating layer before contacting the second barrier layer.

6. The method of claim 5, wherein the second barrier layer is larger than the insulating layer in at least one dimension.

7. The method of claim 1, wherein the second barrier layer is smaller than the first barrier layer in at least one dimension.

8. The method of claim 1, wherein the third barrier layer is brought into contact with the first barrier layer and the second barrier layer and overlaps with a portion of the first barrier layer and a portion of the second barrier layer.

9. The method of claim 8, wherein said third barrier layer is brought into contact with the outer surface of the first barrier layer and the outer surface of the second barrier layer and overlaps with a portion of the first barrier layer and a portion of the second barrier layer.

\* \* \* \* \*